United States Patent
Tian et al.

(10) Patent No.: US 11,171,276 B2
(45) Date of Patent: Nov. 9, 2021

(54) THIN-FILM THERMOCOUPLE PROBE AND METHOD OF PREPARING SAME

(71) Applicant: Xi'an Jiaotong University, Shaanxi (CN)

(72) Inventors: Bian Tian, Shaanxi (CN); Zhongkai Zhang, Shaanxi (CN); Yan Liu, Shaanxi (CN); Zhaojun Liu, Shaanxi (CN); Jiangjiang Liu, Shaanxi (CN); Cunfeng Wang, Shaanxi (CN); Peng Shi, Shaanxi (CN); Qijing Lin, Shaanxi (CN); Zhuangde Jiang, Shaanxi (CN)

(73) Assignee: Xi'an Jiaotong University, Xi'an (CN)

( * ) Notice: Subject to any disclaimer, the term of this patent is extended or adjusted under 35 U.S.C. 154(b) by 0 days.

(21) Appl. No.: 17/118,504

(22) Filed: Dec. 10, 2020

(65) Prior Publication Data

US 2021/0234081 A1     Jul. 29, 2021

(30) Foreign Application Priority Data

Dec. 12, 2019    (CN) .......................... 201911277009.6

(51) Int. Cl.
    *G01K 7/02*             (2021.01)
    *H01L 35/12*           (2006.01)
          (Continued)

(52) U.S. Cl.
    CPC .............. *H01L 35/12* (2013.01); *H01L 35/04* (2013.01); *H01L 35/32* (2013.01); *G01K 7/02* (2013.01)

(58) Field of Classification Search
    CPC ......... H01L 35/12; H01L 35/04; H01L 35/32; H01L 21/67248; H01L 2924/181;
          (Continued)

(56) References Cited

U.S. PATENT DOCUMENTS 2,562,696 A * 7/1951 Alfredh ..................... G01J 5/12
                                                           136/225
4,115,686 A * 9/1978 Williams ................. G01K 7/08
                                                           219/510

(Continued)

FOREIGN PATENT DOCUMENTS

CN         1464292 A      12/2003
CN     101493360 A       7/2009

(Continued)

OTHER PUBLICATIONS

Ximing Chen,Otto J. Gregory,Matin Amani Thin-Film Thermocouples Based on the System In2O3—SnO2 «American Ceramic Society» ,pp. 854-860.

*Primary Examiner* — Gail Kaplan Verbitsky

(57) ABSTRACT

A thin-film thermocouple probe includes a columnar substrate, a tungsten-26% rhenium film and an indium oxide ($In_2O_3$) film. A side surface of the columnar substrate is provided with a first straight groove and a second straight groove. The tungsten-26% rhenium film is arranged on a front end surface of the columnar substrate and in the first straight groove. The indium oxide film is arranged on the front end surface of the columnar substrate and in the second straight groove. The indium oxide film on the front end surface of the columnar substrate is connected to the tungsten-26% rhenium film on the front end surface of the columnar substrate. A first metal lead wire is connected to the tungsten-26% rhenium film, and a second metal lead wire is connected to the indium oxide film. A method of preparing the thin-film thermocouple probe is provided.

7 Claims, 3 Drawing Sheets

(51) Int. Cl.
*H01L 35/04* (2006.01)
*H01L 35/32* (2006.01)

(58) Field of Classification Search
CPC ........... H01L 37/00; H01L 35/26; G01K 7/02; G01K 1/14; G01K 13/00; G01N 30/30
See application file for complete search history.

(56) References Cited

U.S. PATENT DOCUMENTS

| | | | | |
|---|---|---|---|---|
| 4,586,246 A | * | 5/1986 | Oskoui | G01K 7/183 |
| | | | | 29/612 |
| 4,904,091 A | * | 2/1990 | Ward | G01K 1/14 |
| | | | | 136/230 |
| 4,969,956 A | | 11/1990 | Kreider et al. | |
| 5,696,348 A | * | 12/1997 | Kawamura | G01K 1/125 |
| | | | | 136/201 |
| 5,973,296 A | * | 10/1999 | Juliano | B29C 45/2737 |
| | | | | 219/424 |
| 7,365,631 B2 | * | 4/2008 | Chaumeau | G01K 1/16 |
| | | | | 338/22 R |
| 7,553,078 B2 | * | 6/2009 | Hanzawa | G01K 1/08 |
| | | | | 338/22 R |
| 9,267,850 B2 | * | 2/2016 | Aggarwal | G01K 7/02 |
| 2006/0048518 A1 | * | 3/2006 | Bell | F04D 17/162 |
| | | | | 62/3.2 |
| 2013/0148693 A1 | * | 6/2013 | Aggarwal | G01K 7/02 |
| | | | | 374/179 |

FOREIGN PATENT DOCUMENTS

| | | | | |
|---|---|---|---|---|
| CN | 103296191 B | * | 12/2015 | ............ H01L 35/34 |
| CN | 105675160 A | | 6/2016 | |
| CN | 107727263 A | | 2/2018 | |
| CN | 108130032 A | * | 6/2018 | |
| CN | 110004410 A | | 7/2019 | |
| JP | 401033901 A | * | 2/1989 | |
| JP | 402049124 A | * | 5/1989 | |

* cited by examiner

THIN-FILM THERMOCOUPLE PROBE AND METHOD OF PREPARING SAME

CROSS-REFERENCE TO RELATED APPLICATIONS

This application claims the benefit of priority from Chinese Patent Application No. 201911277009.6, filed on Dec. 12, 2019. The content of the aforementioned application, including any intervening amendments thereto, is incorporated herein by reference in its entirety.

TECHNICAL FIELD

The present disclosure relates to design and preparation of sensors and measurements of high temperatures, and more particularly to a thin-film thermocouple probe and a method of preparing the same.

BACKGROUND

Accurate measurements of temperatures at certain parts of an aeroengine, such as surfaces of turbine blades and inner walls of combustion chambers should be ensured to verify the combustion efficiency of the engine and the design of the cooling system. Therefore, equipment for measuring temperatures in a high-temperature flow field is in need. However, there is no similar disclosure of such equipment in the prior art.

SUMMARY

To overcome the above-mentioned defects in the prior art, the present disclosure provides a thin-film thermocouple probe and a method of preparing the same. The thermocouple probe can measure temperature in a high-temperature flow field, and the preparation method is simple.

In a first aspect, the present disclosure provides a thin-film thermocouple probe, comprising:
  a columnar substrate;
  a tungsten-26% rhenium film; and
  an indium oxide ($In_2O_3$) film;
  wherein a side surface of the columnar substrate is provided with a first straight groove and a second straight groove; the tungsten-26% rhenium film is arranged on a front end surface of the columnar substrate and in the first straight groove; the indium oxide film is arranged on the front end surface of the columnar substrate and in the second straight groove; the indium oxide film on the front end surface of the columnar substrate is connected to the tungsten-26% rhenium film on the front end surface of the columnar substrate; a first metal lead wire is connected to the tungsten-26% rhenium film; and a second metal lead wire is connected to the indium oxide film.

In some embodiments, a surface of the indium oxide film and a surface of the tungsten-26% rhenium film are provided with a protective layer, respectively; and the protective layer comprises a first aluminum oxide layer, a silicon carbide (SiC) layer, and a second aluminum oxide layer distributed from top to bottom in sequence.

In some embodiments, the tungsten-26% rhenium film and the indium oxide film on the front end surface of the columnar substrate form a ring-shaped structure and are connected in parallel.

In some embodiments, a joint of the first metal lead wire and the tungsten-26% rhenium film is located in the first straight groove; and a joint of the second metal lead wire and the indium oxide film is located in the second straight groove.

In some embodiments, the first metal lead wire is connected to the tungsten-26% rhenium film through a high-temperature-resistant conductive silver adhesive; and the second metal lead wire is connected to the indium oxide film through a high-temperature-resistant conductive silver adhesive.

In some embodiments, the columnar substrate is a columnar ceramic substrate or a columnar SiC substrate.

In some embodiments, a side surface of a rear end of the columnar substrate is provided with an external thread.

In a second aspect, the present disclosure provides a method of preparing the thin-film thermocouple probe, comprising:
  1) cleaning and drying the columnar substrate;
  2) coating a first shielding layer on the side surface of the columnar substrate; and drying the columnar substrate;
  3) attaching a first photomask on an end face of the columnar substrate; preparing the indium oxide film on the columnar substrate through magnetron sputtering; carrying out photoresist removal for the columnar substrate followed by cleaning and drying;
  4) annealing the columnar substrate obtained in step 3 in a presence of oxygen at 1000° C. for 2 h, so as to increase a density and a carrier concentration of the indium oxide;
  5) cleaning and drying the columnar substrate;
  6) coating a second shielding layer on the side surface of the columnar substrate; and drying the columnar substrate;
  7) attaching a second photomask on the end face of the columnar substrate; preparing tungsten-26% rhenium film on the columnar substrate through magnetron sputtering; carrying out the photoresist removal for the columnar substrate followed by cleaning and drying;
  8) preparing the protective layer on the surface of the tungsten-26% rhenium film and the surface of the indium oxide film through magnetron sputtering; and carrying out heat treatment, so as to eliminate an internal stress of the tungsten-26% rhenium film and the protective layer; and
  9) connecting the first metal lead wire to the tungsten-26% rhenium film; and connecting the second metal lead wire to the indium oxide film to obtain the thin-film thermocouple probe.

The beneficial effects of the present disclosure are described as follows.

The present disclosure provides a thin-film thermocouple probe and a method of preparing the same. The thin-film thermocouple probe adopts a columnar substrate, and a metal-oxide film thermocouple is formed at the end surface of the columnar substrate. A lead wire of the cold junction is led out through a straight groove on a side surface of the columnar substrate. The metal-oxide film thermocouple can measure temperatures in a high-temperature flow field. The thin-film thermocouple probe has a compact and simple structure, and is convenient to be packaged and be arranged in a high-temperature environment to be measured. In addition, the first metal lead wire and the second metal lead wire are arranged at the first straight groove and the second straight groove, so as to prevent the film from being destroyed by other surrounding objects.

Furthermore, the tungsten-26% rhenium film and the indium oxide film which are arranged at the end of the columnar substrate form a ring-shaped structure. The tungsten-26% rhenium film and the indium oxide film are connected in parallel, so as to form two symmetrical hot junctions, thereby outputting a stable signal.

Figure 1:
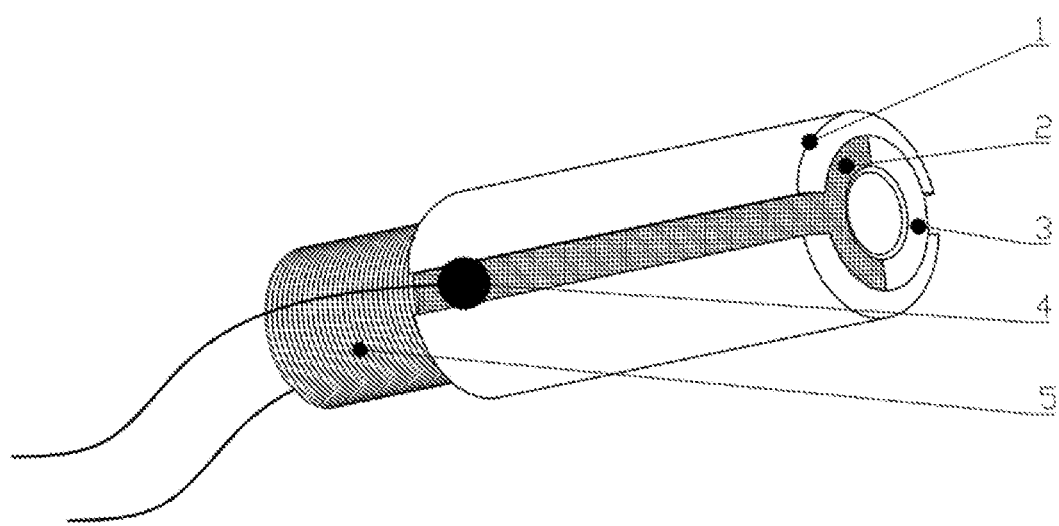
FIG. 1 is a perspective view of a thin-film thermocouple probe in accordance with an embodiment of the present disclosure.

In the drawings: 1, columnar substrate; 2, tungsten-26% rhenium film; 3, indium oxide film; 4, first metal lead wire; and 5, external thread

DETAILED DESCRIPTION OF EMBODIMENTS

The present disclosure will be further described below with reference to the accompany drawings.

Figure 2:
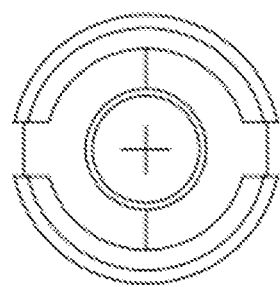
FIG. 2 shows an end surface of a columnar substrate in accordance with an embodiment of the present disclosure.
Figure 3:
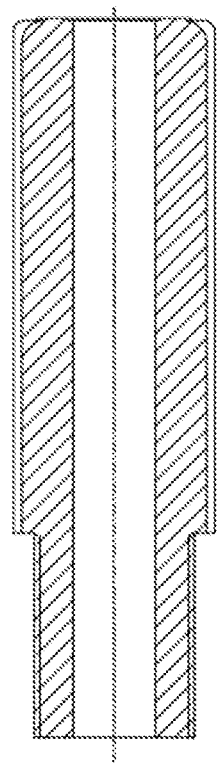
FIG. 3 is a cross-sectional view of the columnar substrate in accordance with an embodiment of the present disclosure.
Figure 4:
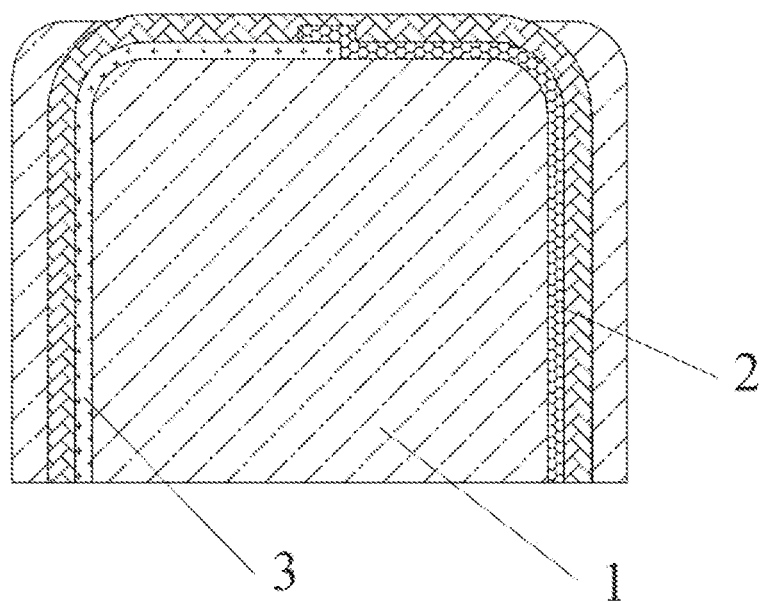
FIG. 4 is a cross-sectional view of the thin-film thermocouple probe in accordance with an embodiment of the present disclosure.

As shown in FIGS. 1-4, the present disclosure provides a thin-film thermocouple probe, which includes a columnar substrate 1, a tungsten-26% rhenium film 2 and an indium oxide ($In_2O_3$) film 3. A side surface of the columnar substrate 1 is provided with a first straight groove and a second straight groove. The tungsten-26% rhenium film 2 is arranged on a front end surface of the columnar substrate 1 and in the first straight groove. The indium oxide film 3 is arranged on the front end surface of the columnar substrate 1 and in the second straight groove. The indium oxide film 3 on the front end surface of the columnar substrate 1 is connected to the tungsten-26% rhenium film 2 on the front end surface of the columnar substrate 1. A first metal lead wire 4 is connected to the tungsten-26% rhenium film 2, and a second metal lead wire is connected to the indium oxide film 3. A width of each of the first straight groove and the second straight groove is 2 mm. Round corners are adopted as transitions from the first straight groove and the second straight groove to the front end surface of the columnar substrate 1.

A surface of the indium oxide film 3 and a surface of the tungsten-26% rhenium film 2 are provided with a protective layer, respectively. The protective layer includes a first aluminum oxide layer, a SiC layer, and a second aluminum oxide layer distributed from top to bottom in sequence.

Tungsten-26% rhenium and indium oxide are used as thermoelectric materials, and a hot junction of the thermocouple is integrated at an end of a sensor through performing magnetron sputtering on a three-dimensional complex anisotropic ceramic substrate. A cold junction is led out through the straight grove at the side surface of the columnar substrate 1, so as to avoid being in the same high temperature zone as the hot junction. The tungsten-26% rhenium film 2 and the indium oxide film 3 at an end of the columnar substrate 1 form a ring-shaped structure and are connected in parallel. Two hot junctions are symmetrically arranged at the end of the sensor. The ring-shaped parallel structure formed by the indium oxide film 3 and the tungsten-26% rhenium film 2 on the columnar substrate 1 has an inner diameter of 4.5 mm, an outer diameter of 7.5 mm and a thickness of 1 mm.

A joint of the first metal lead wire 4 and the tungsten-26% rhenium film 2 is located in the first straight groove, and a joint of the second metal lead wire and the indium oxide film 3 is located in the second straight groove. The first metal lead wire 4 is connected to the tungsten-26% rhenium film 2 through a high-temperature-resistant conductive silver adhesive, and the second metal lead wire is connected to the indium oxide film 3 through a high-temperature-resistant conductive silver adhesive.

The columnar substrate 1 is a columnar ceramic substrate or a columnar SiC substrate, which has excellent high-temperature resistance property, and shock and explosion resistance property. A side surface of a rear end of the columnar substrate 1 is provided with an external thread 5.

A method of preparing the thin-film thermocouple probe includes the following steps.

1) The columnar substrate 1 is cleaned and dried. Specially, the columnar substrate 1 is ultrasonically cleaned in an acetone solution for 10 min and in an anhydrous ethanol solution for 10 min, respectively. The cleaned columnar substrate 1 is then rinsed with deionized water and dried.

2) A first shielding layer is coated on the side surface of the columnar substrate 1, and then the columnar substrate 1 is dried at 95° C. for 10 min.

3) A first photomask is attached on an end face of the columnar substrate 1. The indium oxide film 3 is prepared on the columnar substrate 1 through magnetron sputtering. The magnetron sputtering is carried out for 4 h with a power of 150 W and a vacuum degree of $1\times10^{-6}$ Pa. Then, photoresistis removal is carried out for the columnar substrate 1 followed by cleaning and drying. Specifically, the columnar substrate 1 is soaked and cleaned with an acetone solution.

4) The columnar substrate 1 obtained in step 3 is annealed in a presence of oxygen at 1000° C. for 2 h, so as to increase a density and a carrier concentration of the indium oxide.

5) The columnar substrate 1 is cleaned and dried. Specially, the columnar substrate 1 is ultrasonically cleaned in an acetone solution for 10 min and in an anhydrous ethanol solution for 10 min, respectively. The cleaned columnar substrate 1 is then rinsed with deionized water and dried.

6) A second shielding layer is coated on the side surface of the columnar substrate 1, and then the columnar substrate 1 is dried at 95° C. for 10 min.

7) A second photomask is attached on the end face of the columnar substrate 1. The tungsten-26% rhenium film 2 is prepared on the columnar substrate 1 through magnetron sputtering. The magnetron sputtering is carried out for 90 min with a power of 400 W and a vacuum degree of $1\times10^{-6}$ Pa. The second photomask is then removed, and the removing of photoresist is carried out followed by cleaning and drying.

8) The protective layer is prepared on the surface of the tungsten-26% rhenium 2 film and the indium oxide film 3 through multiple times of the magnetron sputtering. Heat treatment is then carried out at 200° C. for 3 h, so as to eliminate an internal stress of the tungsten-26% rhenium film 2 and the protective layer.

9) The first metal lead wire 4 is connected to the tungsten-26% rhenium film 2, and the second metal lead wire is connected to the indium oxide film 3 to obtain a thin-film thermocouple probe.

What is claimed is:

1. A thin-film thermocouple probe, comprising:
    a columnar substrate;
    a tungsten-26% rhenium film; and
    an indium oxide ($In_2O_3$) film;
    wherein a side surface of the columnar substrate is provided with a first straight groove and a second straight groove; the tungsten-26% rhenium film is arranged on a front end surface of the columnar substrate and in the first straight groove; the indium oxide film is arranged on the front end surface of the columnar substrate and in the second straight groove; the indium oxide film on the front end surface of the columnar substrate is connected to the tungsten-26% rhenium film on the front end surface of the columnar substrate; a first metal lead wire is connected to the tungsten-26% rhenium film; and a second metal lead wire is connected to the indium oxide film; and a surface of the indium oxide film and a surface of the tungsten-26% rhenium film are provided with a protective layer, respectively; and the protective layer comprises a first aluminum oxide layer, a silicon carbide (SiC) layer, and a second aluminum oxide layer distributed from top to bottom in sequence.

2. A thin-film thermocouple probe, comprising:
a columnar substrate;
a tungsten-26% rhenium film; and
an indium oxide ($In_2O_3$) film;
wherein a side surface of the columnar substrate is provided with a first straight groove and a second straight groove; the tungsten-26% rhenium film is arranged on a front end surface of the columnar substrate and in the first straight groove; the indium oxide film is arranged on the front end surface of the columnar substrate and in the second straight groove; the indium oxide film on the front end surface of the columnar substrate is connected to the tungsten-26% rhenium film on the front end surface of the columnar substrate; a first metal lead wire is connected to the tungsten-26% rhenium film; and a second metal lead wire is connected to the indium oxide film; and the tungsten-26% rhenium film and the indium oxide film on the front end surface of the columnar substrate form a ring-shaped structure and are connected in parallel.

3. The thin-film thermocouple probe of claim 1, wherein a joint of the first metal lead wire and the tungsten-26% rhenium film is located in the first straight groove; and a joint of the second metal lead wire and the indium oxide film is located in the second straight groove.

4. The thin-film thermocouple probe of claim 1, wherein the first metal lead wire is connected to the tungsten-26% rhenium film through a high-temperature-resistant conductive silver adhesive; and the second metal lead wire is connected to the indium oxide film through a high-temperature-resistant conductive silver adhesive.

5. The thin-film thermocouple probe of claim 1, wherein the columnar substrate is a columnar ceramic substrate or a columnar SiC substrate.

6. A method of preparing the thin-film thermocouple probe of claim 1, comprising:

a) cleaning and drying the columnar substrate;
b) coating a first shielding layer on the side surface of the columnar substrate; and drying the columnar substrate;
c) attaching a first photomask on an end face of the columnar substrate;
preparing the indium oxide film on the columnar substrate through magnetron sputtering; carrying out photoresist removal followed by cleaning and drying;
d) annealing the columnar substrate obtained in step 3 in a presence of oxygen at 1000° C. for 2 h, so as to increase a density and a carrier concentration of the indium oxide;
e) cleaning and drying the columnar substrate;
f) coating a second shielding layer on the side surface of the columnar substrate; and drying the columnar substrate;
g) attaching a second photomask on the end face of the columnar substrate; preparing tungsten-26% rhenium film on the columnar substrate through magnetron sputtering; carrying out the photoresist removal followed by cleaning and drying;
h) preparing the protective layer on the surface of the tungsten-26% rhenium film and the surface of the indium oxide film through magnetron sputtering; and carrying out heat treatment, so as to eliminate an internal stress of the tungsten-26% rhenium film and the protective layer; and
i) connecting the first metal lead wire to the tungsten-26% rhenium film; and connecting the second metal lead wire to the indium oxide film to obtain the thin-film thermocouple probe.

7. A thin-film thermocouple probe, comprising:
a columnar substrate;
a tungsten-26% rhenium film; and
an indium oxide ($In_2O_3$) film;
wherein a side surface of the columnar substrate is provided with a first straight groove and a second straight groove; the tungsten-26% rhenium film is arranged on a front end surface of the columnar substrate and in the first straight groove; the indium oxide film is arranged on the front end surface of the columnar substrate and in the second straight groove; the indium oxide film on the front end surface of the columnar substrate is connected to the tungsten-26% rhenium film on the front end surface of the columnar substrate; a first metal lead wire is connected to the tungsten-26% rhenium film; and a second metal lead wire is connected to the indium oxide film; and a side surface of a rear end of the columnar substrate is provided with an external thread.

* * * * *